United States Patent
Tan et al.

(10) Patent No.: US 7,294,827 B2
(45) Date of Patent: Nov. 13, 2007

(54) ELECTRONIC MODULE WITH LIGHT-BLOCKING FEATURES

(75) Inventors: Teck Tiong Tan, Singapore (SG); Binghua Pan, Singapore (SG); Jeffrey H. Burns, Kokomo, IN (US); John R. Troxell, Sterling Heights, MI (US)

(73) Assignee: Delphi Technologies, Inc., Troy, MI (US)

( * ) Notice: Subject to any disclaimer, the term of this patent is extended or adjusted under 35 U.S.C. 154(b) by 366 days.

(21) Appl. No.: 10/711,476

(22) Filed: Sep. 21, 2004

(65) Prior Publication Data

US 2006/0061889 A1   Mar. 23, 2006

(51) Int. Cl.
  *H01J 5/02* (2006.01)
  *H01L 31/203* (2006.01)
  *H01L 21/00* (2006.01)
(52) U.S. Cl. .......................... 250/239; 257/433; 438/64
(58) Field of Classification Search ................ 250/239; 257/433, 434; 438/64, 65; 348/335, 340, 348/374
  See application file for complete search history.

(56) References Cited

U.S. PATENT DOCUMENTS

| | | | |
|---|---|---|---|
| 5,786,589 A | 7/1998 | Segawa et al. | |
| 5,962,842 A | 10/1999 | Kimura | |
| 6,395,124 B1 * | 5/2002 | Oxman et al. | 156/275.5 |
| 6,396,116 B1 | 5/2002 | Kelly et al. | 257/432 |
| 6,518,656 B1 * | 2/2003 | Nakayama et al. | 257/680 |
| 6,765,236 B2 * | 7/2004 | Sakurai | 257/98 |
| 6,828,543 B1 * | 12/2004 | Chen | 250/208.1 |
| 2002/0057468 A1 * | 5/2002 | Segawa et al. | 358/509 |
| 2003/0214024 A1 * | 11/2003 | Ono | 257/686 |
| 2003/0218251 A1 | 11/2003 | Seo | 257/737 |
| 2004/0095501 A1 | 5/2004 | Aizawa et al. | |
| 2004/0114851 A1 | 6/2004 | Tan et al. | 385/14 |

FOREIGN PATENT DOCUMENTS

DE   102 26 135   1/2004

OTHER PUBLICATIONS

European Search Report dated Jan. 20, 2006.

* cited by examiner

*Primary Examiner*—Que Tan Le
*Assistant Examiner*—Brian J Livedalen
(74) *Attorney, Agent, or Firm*—Jimmy L. Funke

(57) ABSTRACT

An electronic module adapted to sense light and configured to minimize the entry of stray light into the module. The module includes a housing having an opening through which light enters the housing, a first substrate coupled to the housing, a second substrate on the first substrate opposite the housing, and a chip on the second substrate. The first substrate defines a window aligned with the housing so that light traveling through the housing also passes through window. The second substrate defines an opening aligned with the window, and the chip is located over the opening in the second substrate so that a light-sensing element on the chip senses light passing through the opening. The module is equipped with features that prevent light from entering the module through the second substrate, the first substrate, and between the chip and second substrate.

24 Claims, 2 Drawing Sheets

ELECTRONIC MODULE WITH LIGHT-BLOCKING FEATURES

BACKGROUND OF THE INVENTION

1. Field of the Invention

The present invention generally relates to electronic devices. More particularly, this invention relates to reducing the amount of stray light that can enter an optical sensing module.

2. Description of the Related Art

A variety of applications exist and continue to be developed for electronic devices that operate on the basis of optics. For example, image sensors have been developed for use in automotive applications to sense the presence of vehicle occupants and objects in the vicinity of a vehicle. An example of such a sensor is represented in FIG. 1, which depicts a module 10 comprising a lens assembly 12 containing a pair of lenses 14, a housing 16 in which the lens assembly 12 is installed, a glass substrate 18 to which the housing 16 is affixed, and an imager chip 20 with one or more appropriate sensing elements and circuitry for sensing light that has passed through the lenses 14 and the glass substrate 18. Photons impinging the imager chip 20 are converted by the sensing elements into charge carriers (i.e. electron/hole pairs), so that light is electrically detected. As known in the art, the sensing elements may be individual detectors or arrays of detectors, as in CMOS or CCD imager arrays. While two lenses 14 are used in the module 10, it is foreseeable that fewer or more lenses could be employed in optical path, and a lens may not be required for certain imaging applications.

The chip 20 is physically attached to a chip carrier 22 with electrically-conductive (e.g., solder or conductive adhesive or Au/Cu stud bump) connections 24, which also electrically connect the chip circuitry to conductors 26 on the chip carrier 22. The chip carrier 22 can be a flexible substrate laminated to the glass substrate 18. As an example, the chip carrier 22 can be a flexible circuit (also referred to as a flex circuit), which as known in the art is a flexible substrate of an electrically insulating material such as a polyimide or polyester film, often in the form of a flat cable, with patterned conductors (signal lines) along its length. The chip 20 is underfilled on the chip carrier 22 with an underfill material 28 to promote the reliability of the connections 24. The underfill material 28 also fills a gap 30 between the chip 20 and glass substrate 18. Because light sensed by the sensing elements on the chip 20 must pass through the underfill material 28 and gap 30, the underfill material 28 is formed of an optically-matching material, preferably an adhesive, that fully fills the gap 30 without voids and allows unimpeded passage of light.

For use in its application, the module 10 may be used without any enclosure, or placed in an enclosure that minimizes the amount of light leaking in from the environment. From FIG. 1, it can be appreciated that light can enter the module 10 through the glass substrate 18 and the optically-matching underfill material 28, as well as the chip carrier 22 if formed of conventional flex circuit materials. Infrared light can also enter through the chip 20 if formed of a material such as silicon. For modules ultimately housed in an enclosure, it is advantageous to be able to test the modules as they are produced, prior to assembly into enclosures, since their enclosures may or may not be light-impermeable. Modules used alone without an enclosure must be capable themselves of preventing stray light from being detected by the enclosed imager chip 20.

In view of the above, it can be appreciated that it would be desirable to reduce the amount of light that can enter an optical sensing module at the module level.

BRIEF SUMMARY OF THE INVENTION

The present invention is directed to an electronic module adapted to sense light, such as an optical sensing module, that reduces and preferably substantially eliminates the entry of stray light into the module.

An electronic module in accordance with the present invention generally includes a housing having an opening through which light enters the housing, a first substrate coupled to the housing, a second substrate on a surface of the first substrate opposite the housing, and an imager chip disposed on the second substrate. Optionally, one or more lenses may be disposed in the housing so that light entering the opening of the housing passes through the lenses. The first substrate defines a window formed of a material that is at least semitransparent to light having a predetermined wavelength or range of wavelengths (e.g., visible light, near-infrared light, infrared light, etc.), and is aligned with the housing so that light passing through the housing also passes through the window. The second substrate comprises electrical conductors in a material that may be semitransparent to light. The second substrate defines an opening therein that is aligned with the second opening of the housing so that light passing through the housing and the window of the first substrate also passes through the opening. The chip is disposed on the second substrate so as to be located over the opening therein, and so that one or more light-sensing elements on the chip senses light passing through the opening in the second substrate. Electrically-conductive connections electrically connect the light-sensing elements to the electrical conductors on the second substrate. Finally, and according to a preferred aspect of the invention, an opaque layer surrounds the opening of the second substrate and coincides with an edge of the opening to prevent stray light from entering the module and being absorbed by the imager chip. In addition, the module is provided with components for preventing light from entering the module through the first substrate and between the chip and second substrate.

As with previous electronic devices that operate on the basis of optics (e.g., the module 10 of FIG. 1), the electronic module of the present invention preferably is capable of capturing available photons and converting the photons into charge carriers so that light is electrically detected. As such, a preferred aspect of this invention is that, to the extent possible, the module does not allow light (visible, infrared, etc.) that enters the module to escape and does not allow stray light (visible, infrared, etc.) within the surrounding environment to enter the module and be detected, i.e., converted to charge carriers. According to the invention as described above, possible sources of stray light are identified and eliminated to a significant degree, such that the only path of significance for photons of any detectable wavelength to arrive at and be detected is through the path through the opening in the housing, the first substrate, and the opening in the second substrate.

It should be understood that the term "light" as used herein refers to photons of any wavelength that can be detected by the sensing elements contained in the module. As such, the module of this invention can be adapted for detecting visible light (wavelengths of about 400 to 700 nm), near-infrared light (wavelengths of greater than 700 nm up to about 1100 nm), or light of even greater wavelengths.

Other objects and advantages of this invention will be better appreciated from the following detailed description.

DETAILED DESCRIPTION OF THE INVENTION

Figure 1:
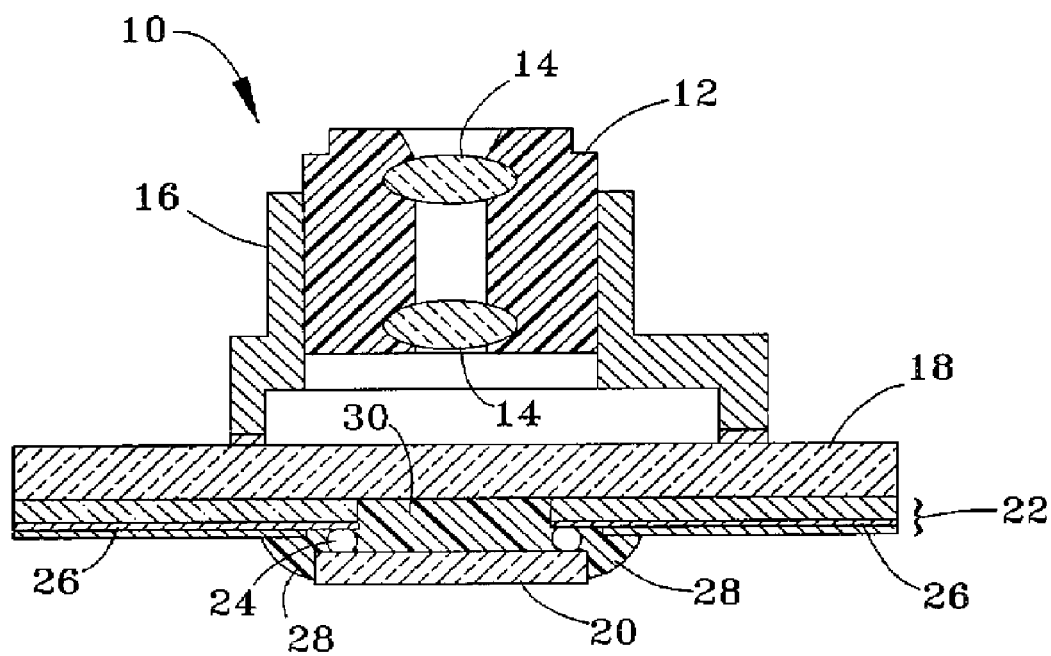
FIG. 1 represents an electronic optical sensing module in accordance with the prior art.
Figure 2:
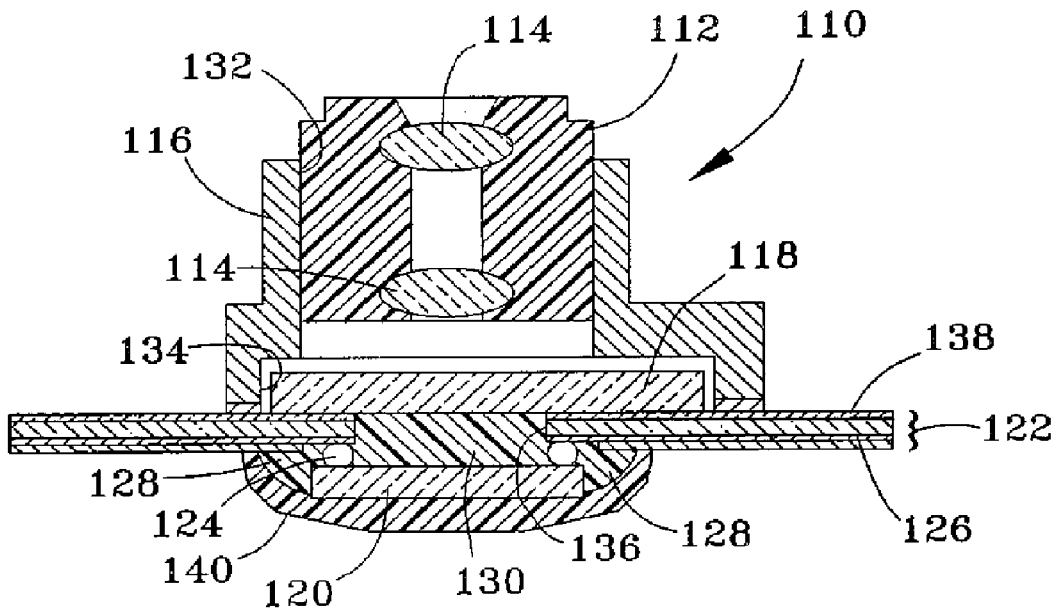
FIGS. 2 and 3 show electronic optical sensing modules in accordance with different embodiments of this invention.

FIGS. 1 and 2 represent optical sensing modules 110 and 210 of the type suitable for use in a variety of applications. Notable examples include automotive applications for sensing the presence of vehicle occupants and objects in the vicinity of a vehicle. For this purpose, each module 110 and 210 is equipped with light-sensing elements (not shown) carried on a chip 120. The particular configuration and operation of these elements is not the subject matter of the present invention, such that any type of light-sensing element can be chosen and used according to the particular application for the module 110 and 210. For example, the sensing elements may be CMOS sensors or common CCD sensors, as well as non-silicon based sensors. Furthermore, while light sensing is of primary interest, the teachings of the invention can be extended to the use of emissive elements (light sources), for example, inorganic or organic light emitting diodes (LEDs) or arrays of LEDs. Finally, though the term "light" is used in the sense of radiation within and near the visible spectrum, most notably visible light and infrared light, it is foreseeable that radiation well outside the visible spectrum may be of interest, and the benefits of this invention could be extended to such applications.

Similar to the module 10 of FIG. 1, the module 110 is represented in FIG. 2 as comprising a lens assembly 112 containing a pair of lenses 114, a housing 116 in which the lens assembly 112 is installed, a substrate 118 to which the housing 116 is bonded, and an imager chip 120 with appropriate elements and circuitry for sensing light that has passed through the lenses 114 and substrate 118. Suitable materials for the substrate 118 are general glass materials, such as Corning Code 1737F, which are essentially transparent to light in the visible and near-infrared wavelengths. In this manner, the substrate 118 defines a window that is aligned with the housing 116 so that light traveling through the housing 116 and lenses 114 also passes through the window. The housing 116 is opaque to the light wavelengths of interest, but otherwise can be of any suitable construction, including molded or machined plastic or metal. The housing 116 has a generally annular or tubular-shape by which an internal passage and oppositely-disposed openings 132 and 134 are defined. The lens assembly 112 can be secured within the internal passage of the housing 116 by any suitable means, such as complementary threads on the lens assembly 112 and housing 116. The type, design and number of the lenses 114 will depend on the particular application, but generally function to focus light passing through the interior of the housing 116 between its openings 132 and 134. As with the housing 116, the lens assembly 112 can be formed of any suitable material, preferably with a coefficient of thermal expansion compatible with that of the housing 116 to avoid or minimize changes in the focal length of the optical system, which would result in blurring of data or images in response to changes in ambient temperature.

In FIG. 2, a chip carrier 122 in the form of a flexible substrate is laminated to a surface of the glass substrate 118 opposite the housing 116. The portion of the housing 116 defining the opening 134 is represented as abutting and bonded to a surface of the chip carrier 122. The chip 120 is physically attached to an opposite surface of the chip carrier 122 with electrically-conductive connections 124, which also electrically connect the chip circuitry to conductors 126 on the chip carrier 122. Connection to the conductors 126 can be through bond pads formed on the carrier 122 or portions of the conductors 126 defined by a cover layer or photoimageable mask on the carrier 122. According to conventional flip-chip technology, the connections 124 are preferably reflowed solder bump joints spaced along the perimeter of the chip 120, individually interconnecting the conductors 126 with bond pads on the chip 120. It is envisioned that other contact technologies, including, for example gold stud bumps, may be similarly employed. As a flexible substrate (flex circuit), the chip carrier 122 comprises an electrically-insulating polymer material such as a polyimide or polyester film, such as in the form of a flat cable, with the conductors 126 serving as circuitry traces for the chip 120 as well as any other surface-mount components (not shown) on the chip carrier 122. While a flexible substrate is a preferred configuration for the chip carrier 122, other suitable substrates could be used. Polymer materials suitable for the carrier 122 are generally semitransparent, such that light is able to pass through the carrier 122 to a degree that the sensitivity of the module 110 would be impaired. As such, the chip 120 is mounted over an opening 136 in the chip carrier 122, so that light passing through the housing 116, lenses 114 and glass substrate 118 is able to freely pass through the carrier 122 and impinge the light-sensing elements on the chip 120.

As seen in FIG. 2, the chip 120 is underfilled on the chip carrier 122 with a material 128 that also completely fills a gap 130 between the chip 120 and the glass substrate 118. As a result, the material 128 must be capable of providing optical matching as well as have flow properties that ensure complete underfilling of the chip 120 and filling of the gap 130. Suitable compositions for this purpose include unfilled epoxy. To promote the reliability of the solder connections 124 in accordance with conventional flip-chip technology, the fill material 128 completely envelopes the solder connections 124 to fill gaps between the connections 124, and forms a fillet that extends onto the sides of the chip 122. Because it fills the gap 130 through which light must pass to reach the chip 120, the fill material 128 is transparent to the light wavelengths to be sensed by the chip 120.

Because of their translucency/transparency, the glass substrate 118, chip carrier 122, and fill material 128 would permit stray light to enter the module 110, reducing its sensitivity. Furthermore, infrared light can enter through the chip 120 if formed of a conventional semiconductor material such as silicon. As such, the module 110 of this invention is adapted to inhibit light within the surrounding environment from entering the module 110 through unintended paths. In particular, the module 110 is configured to inhibit stray light from entering the module 110 through the glass substrate 118, chip carrier 122, fillet of the fill material 128, and chip 120. To obstruct light passing through its semitransparent material, the chip carrier 122 is equipped with a layer that serves as an opaque shielding layer 138. A preferred shielding layer 138 is a metallic, preferably copper, conductor underlayer deposited or laminated on the polymer substrate of the chip carrier 122. Alternatively, the shielding layer 138 can be formed of an electrically-insulating opaque material, e.g., a coating of a dark organic ink, and/or can be applied using a variety of deposition methods. The shielding layer 138 is separate and in addition to the conductors 126 that provide the electrical signal lines through the carrier 122 for the chip 120. In addition to its light-blocking role, the shielding layer 138 in the form of a conductor underlayer can also serve as a ground layer for the chip carrier 122 as a result of being electrically conductive. As seen in FIG. 2, the shielding layer 138 surrounds the opening 136 in the carrier 122 and coincides with the edge of the opening 136 to obstruct light that would otherwise enter the module 110 through the chip carrier 122.

To block light from entering the module 110 through the fill material 128 surrounding the perimeter of the chip 120 as an underfill, an opaque body 140 is shown surrounding the chip 120 to obstruct light paths that include gaps between the connections 124, chip 120 and carrier 122, and the fill material 128. The body 140 is also shown as being deposited over the chip 120 to prevent the entry of infrared radiation through the chip 120. Suitable materials for the body 140 include polymeric adhesives used to overmold electronic devices, such as those known in the art as glob top encapsulants. The body 140 preferably contains black pigment to block light from passing through it, and may contain additional fillers (e.g., silica and alumina) to adjust its mechanical properties and further enhance its light-blocking function.

Finally, FIG. 2 shows the housing 116 as being configured so that the glass substrate 118 is entirely accommodated within its opening 134, such that the portion of the housing 116 defining the opening 134 blocks light that would otherwise enter through the edge of the substrate 118. As seen in FIG. 2, the housing 116 abuts the shielding layer 138, thereby forming an interface that is substantially impermeable to light. If additional light obstruction is necessary, an opaque coating (not shown) can be applied to the surfaces of the substrate 118 along and adjacent its peripheral edges to block light from entering via the edge.

Figure 3:
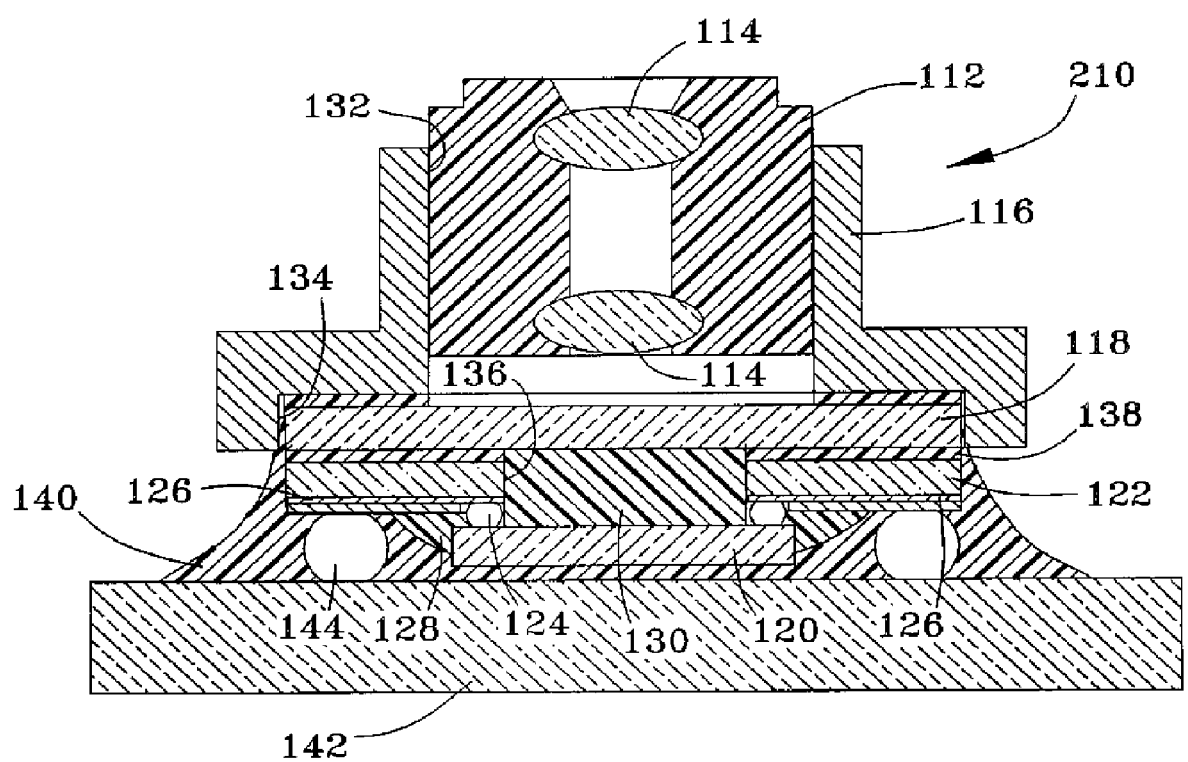

The embodiment of FIG. 3 differs from that of FIG. 2 primarily by packaging the optical sensing module 210 in a BGA (ball grid array) format. For convenience, components of the module 210 are identified in FIG. 3 by the same reference numbers used to identify functionally equivalent components of FIG. 2. With this approach, the module 210 is mounted to a motherboard 142 (e.g., a printed circuit board or other suitable substrate) with a plurality of reflowed solder connections 144 that provide electrical connection between conductors (not shown) on the motherboard 142 and the conductors 126 of the chip carrier 122, such as through openings or plated through-holes (not shown) on the carrier 122. The body 140 is dispensed after the module 210 is mounted to the motherboard 142, and in this manner can also serve as an underfill to improve the mechanical reliability of the solder connections 144 and the assembly as a whole. The body 140 is also shown as being between the chip 120 and motherboard 142 to prevent the entry of infrared radiation through the chip 120. Under some circumstances in which the motherboard 142 is opaque to the wavelengths of interest, the motherboard 142 may sufficiently obstruct light that would otherwise pass through the gaps between the connections 124 and 144, the chip 120 and carrier 122, and the fill material 128, such that the body 140 can be eliminated.

While the invention has been described in terms of particular embodiments, it is apparent that other forms could be adopted by one skilled in the art. For example, the modules 110 and 210 could be configured differently from the embodiments shown, and materials could be used other than those noted. Furthermore, individual or arrays of light emissive elements (e.g., LEDs) could be enclosed in accordance with the invention, using functionally-identical components and light-blocking features as described herein. Accordingly, the scope of the invention is to be limited only by the following claims.

What is claimed is:

1. An electronic module comprising:
    a housing having an opening through which light enters the housing;
    a first substrate coupled to the housing, the first substrate defining a window formed of a material that is at least semitransparent to light of a predetermined wavelength, the window being aligned with the housing so that light passing through the opening of the housing also passes through the window;
    a second substrate on a surface of the first substrate oppositely disposed from the housing, the second substrate comprising electrical conductors and having an opening that is aligned with the housing so that light that passing through the housing and the window of the first substrate also passes unimpeded through the opening;
    a chip disposed on the second substrate so as to be located over the opening therein, the chip having at least one light-sensing element aligned for sensing light of the predetermined wavelength passing through the opening in the second substrate;
    electrically-conductive connections electrically connecting the light-sensing element to the electrical conductors on the second substrate;
    an opaque layer surrounding the opening of the second substrate and coinciding with an edge of the opening, the opaque layer preventing light from entering the module through the second substrate; and
    means for preventing light from entering the module between the chip and the second substrate.

2. The electronic module according to claim 1, wherein the second substrate is a flexible substrate laminated to the first substate.

3. The electronic module according to claim 2, wherein the second substrate is flexible and comprises of an electrically-insulating material containing the electrical conductors.

4. The electronic module according to claim 1, wherein the opaque layer is carried by and bonded to the second substrate.

5. The electronic module according to claim 4, wherein the opaque layer is an electrically-conductive underlayer laminated to a surface of the second substrate.

6. The electronic module according to claim 1, wherein the means for preventing light from entering the module between the chip and the second substrate comprises a body encasing the chip on the second substrate, the body being substantially opaque to light.

7. The electronic module according to claim 6, wherein the body is substantially opaque to infrared light so as to prevent infrared light from entering through the chip.

8. The electronic module according to claim 6, wherein the electrically-conductive connections are spaced apart on the chip to define gaps therebetween, the module further comprising an underfill material that underfills the chip on the second substrate completely fills a gap between the chip and the first substrate, and fills the gaps between the electrically-conductive connections to promote reliability of the electrically-conductive connections, the body encasing the underfill material on the second substrate.

9. The electronic module according to claim 1, further comprising means for preventing light from entering the module through the first substrate.

10. The electronic module according to claim 9, wherein the means for preventing light from entering the module through the first substrate comprises a portion of the housing surrounding the first substrate.

11. The electronic module according to claim 10, wherein the first substrate is entirely accommodated within a second opening of the housing and is surrounded by the portion of the housing.

12. The electronic module according to claim 1, wherein the electronic module is mounted to a motherboard, the electronic module further comprising second electrically-conductive connections that physically attach the second substrate to the motherboard and electrically connect the light-sensing element to the motherboard.

13. The electronic module according to claim 12, further comprising a body encasing the chip between the second substrate and the motherboard, the body being substantially opaque to light.

14. An optical sensing module comprising:
   a housing formed of a material that is opaque to light of a predetermined wavelength, the housing having first and second openings through which light enters and exits the housing, respectively;
   a lens assembly containing at least one lens and disposed in the housing so that light entering and exiting through the first and second openings of the housing pass through the lens;
   a first substrate that is at least semitransparent to light of the predetermined wavelength, the first substrate being coupled to the housing and defining a window aligned with the housing so that light passing through the first opening of the housing, the lens, and the second opening of the housing also passes through the window
   a flexible substrate bonded to a surface of the first substrate oppositely disposed from the housing, the flexible substrate comprising electrical conductors in a material that is at least semitransparent to light of the predetermined wavelength, the flexible substrate having an opening therein that is aligned with the second opening of the housing so that light that passes through the second opening of the housing and the window of the first substrate also passes through the opening;
   a chip disposed on the flexible substrate so as to be located over the opening therein, the chip having at least one light-sensing element aligned to sense light of the predetermined wavelength that has passed through the opening in the flexible substrate;
   solder connections physically attaching the chip to the flexible substrate and electrically connecting the light-sensing element to the electrical conductors on the flexible substrate, the solder connections being spaced apart to define gaps therebetween
   an opaque layer on the flexible substrate, surrounding the opening of the flexible substrate, and coinciding with an edge of the opening, the opaque layer preventing light of the predetermined wavelength from entering the module through the flexible substrate;
   means for preventing light of the predetermined wavelength from entering the module through the first substrate; and
   means for preventing light of the predetermined wavelength from entering the module through the gaps between the solder connections.

15. The optical sensing module according to claim 14, wherein the flexible substrate comprises a flat cable of an electrically-insulating material, and the electrical conductors comprise circuitry traces for the chip and other surface-mount components on the flexible substrate.

16. The optical sensing module according to claim 14, wherein the opaque layer is a metallic ground layer laminated to a surface of the flexible substrate or an organic coating deposited on a surface of the flexible substrate.

17. The optical sensing module according to claim 14, wherein the means for preventing light from entering the module through the gaps between the solder connections comprises a body encasing the chip on the flexible substrate, the body being substantially opaque to light of the predetermined wavelength.

18. The optical sensing module according to claim 17, wherein the body is substantially opaque to infrared light so as to prevent infrared light from entering through the chip.

19. The optical sensing module according to claim 17, further comprising an underfill material that underfills the chip on the flexible substrate and completely fills a gap between the chip and the first substrate to promote reliability of the solder connections, the body encasing the underfill material on the flexible substrate.

20. The optical sensing module according to claim 14, wherein the means for preventing light from entering the module through the first substrate comprises a portion of the housing defining the second opening thereof.

21. The optical sensing module according to claim 20, wherein the portion of the housing abuts and is bonded to the flexible substrate.

22. The optical sensing module according to claim 20, wherein the first substrate is entirely accommodated within the second opening of the housing and is surrounded by the portion of the housing.

23. The optical sensing module according to claim 14, wherein the optical sensing module is mounted to a motherboard, the optical sensing module further comprising second solder connections that physically attach the flexible substrate to the motherboard and electrically connect the light-sensing element to the motherboard.

24. The optical sensing module according to claim 23, further comprising a body encasing the chip between the flexible substrate and the motherboard, the body being substantially opaque to light of the predetermined wavelength.

* * * * *